United States Patent [19]

Ismail et al.

[11] Patent Number: 5,229,093

[45] Date of Patent: Jul. 20, 1993

[54] METHOD FOR MAKING MULLITE WHISKERS USING HYDROFLUORIC ACID

[75] Inventors: M. G. M. U. Ismail; Hiroshi Arai; Zenjiro Nakai, all of Kumagaya, Japan

[73] Assignee: Chichibu Cement Co., Ltd., Japan

[21] Appl. No.: 893,950

[22] Filed: Jun. 4, 1992

Related U.S. Application Data

[63] Continuation of Ser. No. 667,106, Mar. 11, 1991, abandoned.

[30] Foreign Application Priority Data

Mar. 15, 1990 [JP] Japan .................................... 2-62530

[51] Int. Cl.$^5$ ...................... C04B 38/04; C03C 13/00; C30B 29/62
[52] U.S. Cl. ...................... 423/327.2; 156/DIG. 112; 423/328.2; 501/68; 502/64
[58] Field of Search .......................... 423/327.2, 328.2; 156/DIG. 64, DIG. 112; 501/68, 153, 154; 502/64, 77

[56] References Cited

U.S. PATENT DOCUMENTS

| | | | |
|---|---|---|---|
| 3,826,813 | 7/1974 | Gardner et al. ..................... | 423/328 |
| 4,217,240 | 8/1980 | Bergna ................................ | 423/328 |
| 4,251,279 | 2/1981 | Ekdahl ................................ | 501/68 |
| 4,511,664 | 4/1985 | Yamamoto ........................ | 501/68 |
| 4,826,789 | 5/1989 | Jones et al. ........................ | 501/68 |
| 4,826,790 | 5/1989 | Jones et al. ........................ | 501/80 |
| 4,910,172 | 3/1990 | Talmy et al. ..................... | 423/327.2 |
| 4,911,902 | 3/1990 | Talmy et al. ..................... | 423/327.2 |

FOREIGN PATENT DOCUMENTS

| | | | |
|---|---|---|---|
| 1-212299 | 8/1989 | Japan . | |
| 2-157200 | 6/1990 | Japan ........................ | 156/DIG. 112 |
| 2212795 | 8/1989 | United Kingdom ................ | 423/328 |

Primary Examiner—Olik Chaudhuri
Assistant Examiner—Ken Horton
Attorney, Agent, or Firm—King and Schickli

[57] ABSTRACT

A method for making mullite whiskers includes the steps of:

preparing a mullite-intensive sol by mixing an alumina sol with a silica sol at a molar $Al_2O_3/SiO_2$ ratio of 1.37–1.76, gelating said mullite-intensive sol by adding HF thereto at a molar $HF/3Al_2O_3 \cdot 2SiO_2$ ratio of 0.01–0.1, drying the gel at a temperature lower than 120 10 ° C.; and calcining the dried product in an open system at a temperature up to 1000° C. and in a closed system at a temperature from 1200°–1600° C.

5 Claims, 1 Drawing Sheet

METHOD FOR MAKING MULLITE WHISKERS USING HYDROFLUORIC ACID

This is a continuation of application Ser. No. 07/667,106, filed Mar. 11, 1991, now abandoned.

FIELD OF THE INVENTION

The present invention relates to a method for making mullite whiskers which are used as fillers for e.g., whisker-reinforced composite ceramics or polymers.

STATEMENT OF THE PRIOR ART

Mullite is an aluminum silicate expressed by the following formula:
$3Al_2O_3 \cdot 2SiO_2$ (with a molar $Al_2O_3/2SiO_2$ ratio of 1.5), and forms a solid solution with alumina at a molar $Al_2O_3/SiO_2$ ratio in the range of 1.5 to 2.87 according to J.A. Pask "Ceramic International", (4), pp.107–113 (1983).

Heretofore, mullite has been used for porcelains and refractories in the chemical industry. In recent years, however, it has been found to exhibit a low coefficient of thermal expansion and dielectric constant. properties at high temperatures and high thermal shock resistance. This, it is now believed that mullite may be used to provide promising ceramics for electronic materials (IC boards and packages) superior to alumina and favorable ceramics for high-temperature structural materials (delivery rollers used at high temperatures and calcining tools) superior to silicon carbide.

A grave problem with mullite ceramics, however, is that they exhibit poor fracture resistance.

In order to provide a solution to this problem, it has been proposed to incorporate in the mullite ceramics fibrous or whiskery reinforcements such as carbon fibers or silicon carbide whiskers. The possibility of incorporation of alumina or mullite whiskers has also been taken into consideration.

Heretofore, mullite whiskers have been made by a gas-phase reaction technique. Japanese Patent Kokai Publication No. 1(1989)-212299 sets forth another technique for making mullite whiskers having an aspect ratio of 10 or more, in which 1–30 atomic % of $AlF_3$ are added to a feed mixture containing $SiO_2$ and $Al_2O_3$ sources at a ratio sufficient to form mullite, followed by calcining at a temperature of 800°–1600° C.

Serious problems have been found to exist with the above-mentioned gas-phase reaction technique. More particularly, the growth of mullite whiskers occurs at too slow a rate. Accordingly, larger quantities of expensive feed gases must be used giving rise to a significant increase in the production cost.

A problem with the $AlF_3$—addition technique, as proposed in Japanese Patent Kokai Publication No. 1-212299, is the difficulty encountered in the uniform mixing of the mullite feed with $AlF_3$ (which is available in the form a solid particles). Because of this mixing problem, whisker yield suffers. Another problem is that the resulting mullite is so rich in $Al_2O_3$, as expressed in terms of $Al_2O_3=73.7$ mol %, that it is significantly removed from the theoretical composition of mullite in which $Al_2O_3=60$ mol %.

A main object of this invention is therefore to provide a method for making mullite whiskers of high quality, in which no coagulation of the particles takes place.

A second object of this invention is to provide a method for making mullite whiskers with a purity sufficiently high to be close to a theoretical composition value.

A third object of this invention is to provide a method for making mullite whiskers at low costs.

SUMMARY OF THE INVENTION

According to this invention, the above-mentioned objects are achieved by the provision of a method for making mullite whiskers, characterized by including the steps of:
preparing a mullite-intensive sol by mixing an alumina sol with a silica sol,
gelating said mullite-intensive sol by adding hydrofluoric acid (HF), thereto,
drying the gel obtained at the gelation step; and
calcining the dried product obtained at the drying step.

BRIEF DESCRIPTION OF THE DRAWINGS

The present invention will become apparent from the following detailed description with reference to the accompanying drawings, in which.

DETAILED EXPLANATION OF THE INVENTION

Figure 1:
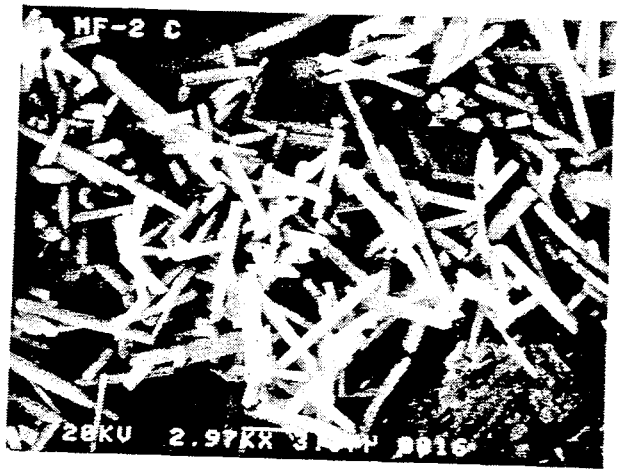
FIG. 1 is an electron microscope photograph of the mullite whiskers obtained by carrying out this invention.

In the method for making mullite whiskers according to this invention, it is preferred that the alumina and silica sols are mixed together at a molar $Al_2O_3/SiO_2$ ratio in the range of 1.37 to 1.76. It is also preferred that HF is added at a molar $HF/3Al_2O_3 \cdot 2SiO_2$ ratio in the range of 0.01 to 0.1. Drying should preferably be carried out at a temperature of 120° C. or lower, and calcining should desirously be performed in an open system at a temperature up to 1000° C. to 1200°–1600° C.

Referring again to the molar $Al_2O_3/SiO_2$ ratio of the alumina-mullite sol being preferably in the range of 1.37 to 1.76, cristobalite ($SiO_2$) tends to crystallize out at a ratio less than 1.37. In addition, corundum ($\alpha$-$Al_2O_3$) is likely to crystallize out at a ratio higher than 1.76. For these reasons the molar $Al_2O_3/SiO_2$ ratio should preferably be limited to the range of 1.37 to 1.76. Otherwise it is not possible to produce high-purity mullite whiskers.

In the preparation of the mullite-intensive sol, the alumina (boehmite) sol should preferably be used. Such an alumina sol is obtained by peptizing a dispersion of alumina in water. This is done by adding thereto a suitable amount of an inorganic acid such as nitric or hydrochloric acid or an organic acid such as acetic or formic acid, while it is heated to 80° C. or higher. The alumina sol may also be obtained by the peptization of $\tau$-alumina with inorganic or organic acid assuming a spinel type deficient structure and having a high activity.

As the silica sol, use may be made of a colloidal silica (silica sol) or ultrafine silica particles having a high reactivity. The colloidal silica is a colloidal solution of ultrafine silica particles dispersed in water. The ultrafine silica particles, for instance, include white carbon prepared by a wet technique and dry-fumed silica.

HF is selected for the reason that since it is available in the form of an aqueous solution, it can be uniformly mixed by a wet process.

As already stated, the amount of HF added should preferably be in the range of 0.01 to 0.1, when expressed in terms of the molar $HF/3Al_2O_3 \cdot 2SiO_2$ ratio. This is because it is ineffective at less than 0.01, whereas coagulated particles other than whiskers are likely to occur at molar concentrations higher than 0.1.

As mentioned above, the gel should preferably be dried at a temperature of 120° C. or lower. This is because drying at temperatures higher than 120° C. causes HF to evaporate off to the extent that the reaction:

$$M-O-OH + HF \rightarrow M-O-F + H_2O$$

wherein M stands for Al or Si is less likely to occur. This makes it difficult to obtain mullite whiskers.

Then, the mullite-intensive gel obtained as mentioned above is finely pulverized by a pulverizer such as a ball or stirring mill. While taking contamination into account, high-purity mullite powders are thereby obtained. The powders should preferably be calcined in an open system at a temperature up to 1000° C. so as to dehydrate the hydrate and in a closed system at a temperature from 1000° C. to the calcining temperature so as to ensure that the F component decomposed during calcining is brought into full contact with the $Al_2O_3 \cdot SiO_2$ sources.

EXAMPLES

The starting alumina and silica sols were first prepared in the following manners.

A boehmite sol as the alumina sol was obtained by adding commercially available boehmite powders (Catapal B commercialized by Vista Chemical Co., Ltd.; containing 73.0% by weight $Al_2O_3$) to ion exchange water together with nitric acid and heating the solution at 80° C. under atmospheric pressure for 3 hours.

The silica sol was obtained by adding commercially available colloidal silica powders (Nipsil E220A commercialized by Nippon Silica Co., Ltd.; containing 92.4% by weight of $SiO_2$) to ion exchanged water together with nitric acid and regulating the pH of the solution to 3 or less under atmospheric pressure.

The thus obtained alumina and silica sols were then mixed together at a molar $Al_2O_3/SiO_2$ ratio in the range of 1.37 to 1.76 to prepare mullite-intensive sols.

The thus obtained sols were then gelated by the addition of 47% hydrofluoric acid at a molar $HF/3Al_2O_3 \cdot 2SiO_2$ ratio in the range of 0.008 to 0.15. The obtained gels were thereafter dried at 90°-130° C. for 48 hours, followed by pulverization with a ball mill.

The thus obtained gel powders were heat-treated in an open system at a temperature of 600° C. for 30 minutes, and were then calcined in a closed vessel at a temperature of 1150° to 1650° C. for 1 hour.

The products as mentioned above were analyzed by X-ray diffraction in terms of their composition and observed under an election microscope in terms of their morphologies. The results are set out in Table 1.

TABLE 1

| | $HF/3Al_2O_3 \cdot 2SiO_2$ | Drying Temp. | Calcining Temp. | Composition | Morphology |
|---|---|---|---|---|---|
| Ex. 1 | 0.02 | 90° C. | 1300° C. | Mullite | Whiskers |
| 2 | 0.02 | 90° C. | 1200° C. | Mullite | Whiskers |
| 3 | 0.10 | 90° C. | 1300° C. | Mullite | Whiskers |

Figure 2:
FIG. 2 is an electron radiation diffraction pattern of the mullite whiskers prepared by practicing this invention.

FIGS. 1 and 2 are an electron microscope photograph and an electron radiation diffraction pattern of the mullite whiskers obtained in the examples, respectively.

As can be seen from the photograph and pattern, the products consist only of uniform whiskers of single crystals grown in the direction [001] and have an aspect (length/diameter ratio of 10 or more.

According to the present invention as detailed above,
(1) high-quality whiskers with no particles adhering to them are obtainable, since uniform mixing is achieved by a wet process using HF;
(2) mullite with a purity sufficiently high to be close to a theoretical composition value is obtainable by the sol-gel reaction; and
(3) mullite whiskers are obtainable at low costs with inexpensive raw materials and by a simple process.

What is claimed is:

1. A method for making mullite whiskers, which includes the steps of:
   preparing a mullite-intensive sol by mixing an alumina sol with a silica sol,
   gelating said mullite-intensive sol by adding hydrofuloric acid thereto,
   drying the gel obtained at the gelation step; and
   calcining the dried product obtained at the drying step.

2. A method for making mullite whiskers as claimed in claim 1, wherein said alumina and silica sols are mixed together at a molar $Al_2O_3/SiO_2$ ratio in the range of 1.37 to 1.76.

3. A method for making mullite whiskers as claimed in claim 1, wherein hydrofluoric acid is added at a molar $HF/3Al_2O_3 \cdot 2SiO_2$ ratio in the range of 0.01 to 0.1.

4. A method for making mullite whiskers as claimed in claim 1, wherein said drying is carried out at a temperature lower than 120° C.

5. A method for making mullite whiskers as claimed in claim 1, wherein said calcining is carried out in an open system at a temperature up to 1000° C. and in a closed system at a temperature from 1200° C. to 1600° C.

* * * * *